United States Patent
Kato (10) Patent No.: US 9,040,434 B2
(45) Date of Patent: May 26, 2015

(54) FILM DEPOSITION METHOD AND FILM DEPOSITION APPARATUS (71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/938,310

(22) Filed: Jul. 10, 2013

(65) Prior Publication Data
US 2014/0017909 A1    Jan. 16, 2014

(30) Foreign Application Priority Data

Jul. 13, 2012 (JP) .................................. 2012-157709

(51) Int. Cl.
*H01L 21/02* (2006.01)
*C23C 16/04* (2006.01)
*C23C 16/40* (2006.01)
*C23C 16/455* (2006.01)

(52) U.S. Cl.
CPC .... *H01L 21/02263* (2013.01); *H01L 21/02164* (2013.01); *H01L 21/02211* (2013.01); *H01L 21/02274* (2013.01); *H01L 21/0228* (2013.01); *C23C 16/045* (2013.01); *C23C 16/402* (2013.01); *C23C 16/4554* (2013.01); *C23C 16/45551* (2013.01)

(58) Field of Classification Search
None
See application file for complete search history.

(56) References Cited

U.S. PATENT DOCUMENTS

| | | | |
|---|---|---|---|
| 6,171,945 B1 * | 1/2001 | Mandal et al. | 438/622 |
| 7,524,735 B1 * | 4/2009 | Gauri et al. | 438/436 |
| 2010/0260935 A1 * | 10/2010 | Kato et al. | 427/255.28 |

FOREIGN PATENT DOCUMENTS

JP    4661990    3/2011

* cited by examiner

*Primary Examiner* — Charles Garber
*Assistant Examiner* — Alia Sabur
(74) *Attorney, Agent, or Firm* — IPUSA, PLLC (57) ABSTRACT

A film deposition method includes a step of condensing hydrogen peroxide on a substrate including a concave portion formed in a surface thereof by supplying a gas containing the hydrogen peroxide, and a step of supplying a silicon-containing gas reactable with the hydrogen peroxide to the substrate having the hydrogen peroxide condensed thereon.

5 Claims, 12 Drawing Sheets

FILM DEPOSITION METHOD AND FILM DEPOSITION APPARATUS

CROSS-REFERENCE TO RELATED APPLICATIONS

This patent application is based upon and claims the benefit of priority of Japanese Patent Application No. 2012-157709, filed on Jul. 13, 2012, the entire contents of which are incorporated herein by reference.

BACKGROUND OF THE INVENTION

1. Field of the Invention

The present invention relates to a film deposition method and a film deposition apparatus that deposit a reaction product of at least two kinds of reaction gases that react with each other by alternately supplying the gases to the substrate, and more specifically to a film deposition method and a film deposition apparatus appropriate for filling a concave portion formed in a surface of the substrate with the reaction product.

2. Description of the Related Art

A process of fabricating a semiconductor integrated circuit (i.e., IC) includes a process of filling a concave portion formed in a surface of a substrate, such as a trench, a via hole, or a space in a line-space pattern, with silicon oxide. For example, as disclosed in Japanese Patent No. 4661990, in filling the concave portion with the silicon oxide, in order to prevent a void from being caused in the silicon oxide film filled in the concave portion, a film deposition method that can deposit the silicon oxide film along the concave portion (in a conformal manner) is preferably adopted.

In filling the concave portion with the silicon oxide by the film deposition method that can deposit a film in a conformal manner, as the silicon oxide film deposited on both side walls of the concave portion becomes thick, surfaces of the oxide film on the side walls become closer to each other, and eventually contact near the center of the concave portion, by which the concave portion is filled with the silicon oxide film. However, a contact surface (i.e., a seam) where the silicon oxide film on both side walls contacts with each other may separate from each other if the silicon oxide film on the side walls in the concave portion contracts in a heating process performed after the concave portion filling process, and may cause a void within the silicon oxide film. Moreover, in an etching process performed after the concave portion filling process, the etching may be accelerated along the seam, which may cause the void.

SUMMARY OF THE INVENTION

Embodiments of the present invention provide a novel and useful film deposition method and film deposition apparatus solving one or more of the problems discussed above.

More specifically, the embodiments of the present invention may provide a film deposition method and a film deposition apparatus that can prevent a seam from being formed in filling a concave portion of a substrate with a silicon oxide film.

According to one embodiment of the present invention, there is provided a film deposition method that includes a step of condensing hydrogen peroxide on a substrate including a concave portion formed in a surface thereof by supplying a gas containing the hydrogen peroxide, and a step of supplying a silicon-containing gas reactable with the hydrogen peroxide to the substrate having the hydrogen peroxide condensed thereon.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

<Film Deposition Apparatus>

Figure 1:
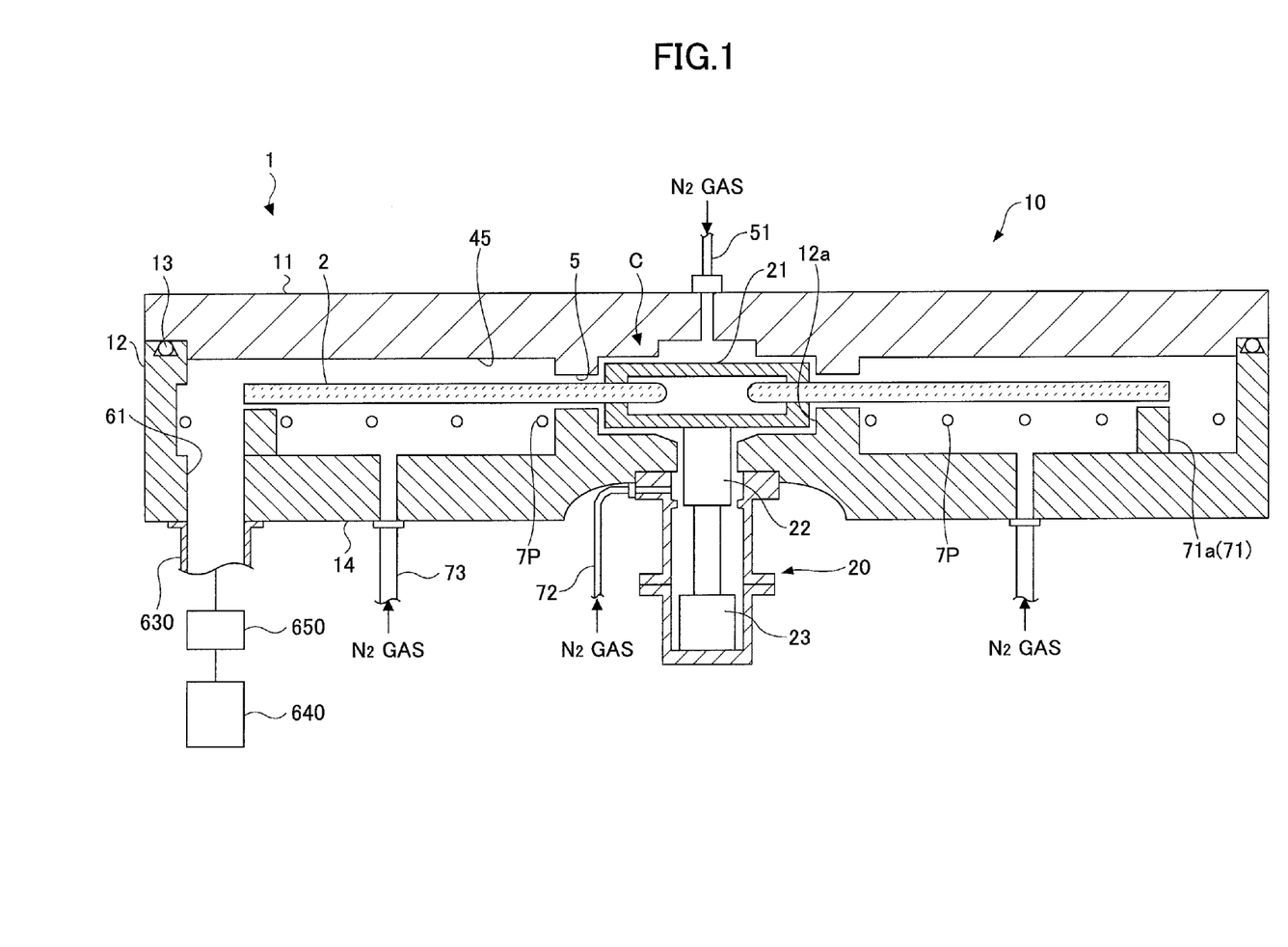
FIG. 1 is a schematic cross-sectional view illustrating a film deposition apparatus of an embodiment of the present invention.
Figure 2:
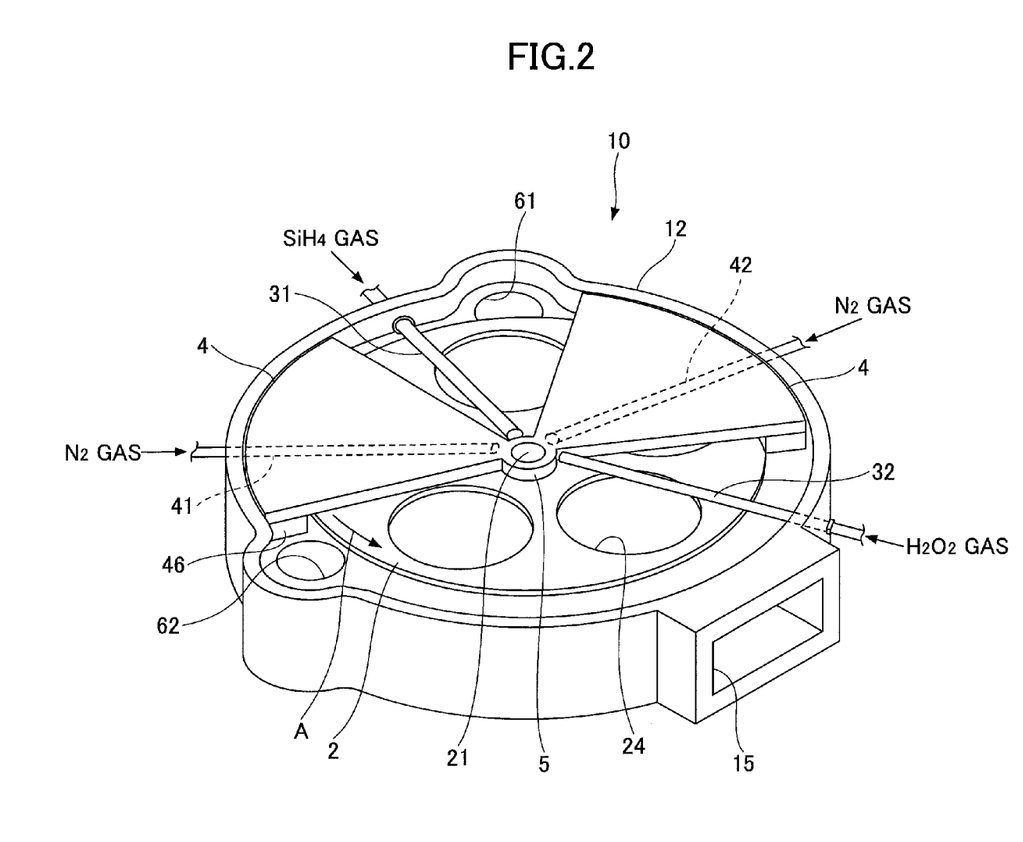
FIG. 2 is a schematic perspective view of the film deposition apparatus in FIG. 1.
Figure 3:
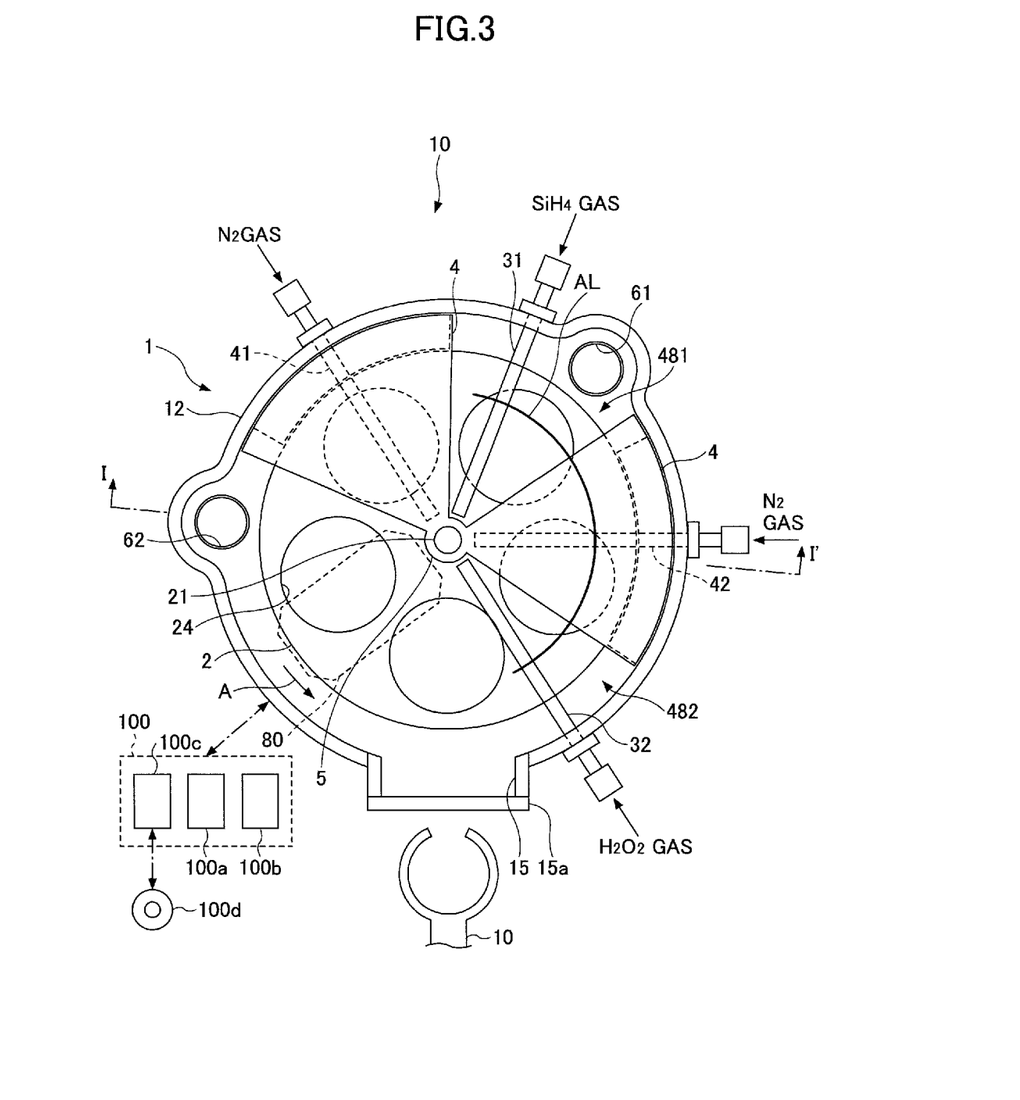
FIG. 3 is a schematic top view of the film deposition apparatus in FIG. 1.

To begin with, a description is given below of a non-limiting, illustrative embodiment of the present invention. FIG. 1 is a schematic cross-sectional view of the film deposition apparatus. FIG. 2 is a schematic perspective view to explain a structure within a vacuum chamber 1. FIG. 3 is a schematic top view to explain a structure within the vacuum chamber 1. In FIGS. 2 and 3, depicting a ceiling plate 11 is omitted for convenience of explanation.

With reference to FIGS. 1 through 3, the film deposition apparatus includes a vacuum chamber 1 whose planar shape is approximately round in shape, and a turntable 2 provided in the vacuum chamber 1 having a center of rotation that coincides with the center of the vacuum chamber 1. The vacuum chamber 1 includes a chamber body 12 having a cylindrical shape with a bottom, and a ceiling plate 11 hermetically arranged on an upper surface of the chamber body 12 to be attachable to or detachable from the chamber body 12 through a seal member 13 (see FIG. 1) such as an O-ring.

The turntable 2 is made of a metal with high thermal conductivity such as aluminum. Moreover, the turntable 2 is fixed to a core portion 21 having a cylindrical shape at the center portion, and the core portion 21 is fixed to an upper end of a rotational shaft 22 that extends in a vertical direction. The rotational shaft 22 penetrates through a bottom part 14 of the vacuum chamber 1, and the lower end is attached to a drive part 23. The drive part 23 allows the rotational shaft 22 and the turntable 2 (see FIG. 1) to rotate around the vertical axis.

Furthermore, the rotational shaft 22 and the drive part 23 are housed in a cylindrical case body 20 whose upper surface is open. A flange part provided on the upper surface of this case body 20 is hermetically attached to the lower surface of a bottom part 14 of the vacuum chamber 1, by which the internal atmosphere of the case body 20 is separated from the external atmosphere.

As illustrated in FIGS. 2 and 3, a plurality of circular shaped wafer receiving portion 24 is provided to allow a plurality of (five in the example of FIG. 3) semiconductor wafers (which are hereinafter called "a wafer or wafers") to be disposed along a rotational direction (i.e., a circumferential direction) W. In FIG. 3, the wafer W is shown in a single wafer receiving portion 24 for convenience. This wafer receiving portion 24 has an inner diameter that is slightly greater, for example, 4 mm, than a diameter of the wafer W (e.g., 300 mm), and a depth approximately equal to a thickness of the wafer. Accordingly, when the wafer W is placed on the wafer receiving portion 24, the surface of the wafer W and the surface of the turntable 2 (which means an area where the wafer is not placed) have approximately the same height.

As illustrated in FIGS. 2 and 3, above the turntable 2, a reaction gas nozzle 31, a separation gas nozzle 41, a reaction gas nozzle 32, and a separation gas nozzle 42 are arranged at intervals in a circumferential direction of the vacuum chamber 1, in this order. These nozzles 31, 32, 41 and 42 are introduced into the vacuum chamber 1 from an external wall by fixing gas introduction ports, which are base end portions of the respective nozzles 31, 32, 41 and 42, to the external wall of the chamber body 12 (see FIG. 3), and are installed such as to extend along a radial direction of the chamber body 12 and to extend parallel to the turntable 2.

The reaction gas nozzles 31 and 32 include a plurality of gas discharge holes 33 that are open downward facing the turntable 2 (see FIG. 4) and are arranged along lengthwise directions of the reaction gas nozzles 31 and 32 at intervals of, for example, 10 mm.

As illustrated in FIG. 3, the reaction gas nozzle 31 is connected to a silicon (Si) gas supply source (which is not shown in the drawing) filled with a silane ($SiH_4$) gas, through an on-off valve and a flow rate controller (both of which are not shown in the drawing). This allows the $SiH_4$ gas to be supplied to the wafer W placed on the wafer receiving portion 24 of the turntable 2 from the reaction gas nozzle 31. The reaction gas nozzle 32 is connected to an $H_2O_2$ gas supply source (which is not shown in the drawing) storing a hydrogen peroxide ($H_2O_2$). The $H_2O_2$ supply source may be, for example, a bubbler to which an inactive gas such as a nitrogen ($N_2$) gas or a noble gas is connected. By supplying the inactive gas to the bubbler through an on-off valve and a flow rate controller (both of which are not shown in the drawing), the $H_2O_2$ gas is supplied to the wafer placed on the wafer receiving portion 24 from the reaction gas nozzle 32.

Here, an area under the reaction gas nozzle 31 may be called a first process area P1 to supply the $SiH_4$ gas to the wafer W. An area under the reaction gas nozzle 32 may be called a second process area P2 to adsorb the $H_2O_2$ gas on the wafer W.

Moreover, the separation gas nozzles 41 and 42 include a plurality of gas discharge holes $42h$ that are open downward facing the turntable 2 (see FIG. 4) and are arranged along lengthwise directions of the separation gas nozzles 41 and 42 at intervals of, for example, 10 mm. Furthermore, the separation gas nozzles 41 and 42 are connected to a source of an inert gas such as a noble gas including Ar or He or the like, or an $N_2$ gas, through an on-off valve and a flow rate controller (both of which are not shown in the drawing). In the present embodiment, the $N_2$ gas is used as the inert gas.

Figure 4:
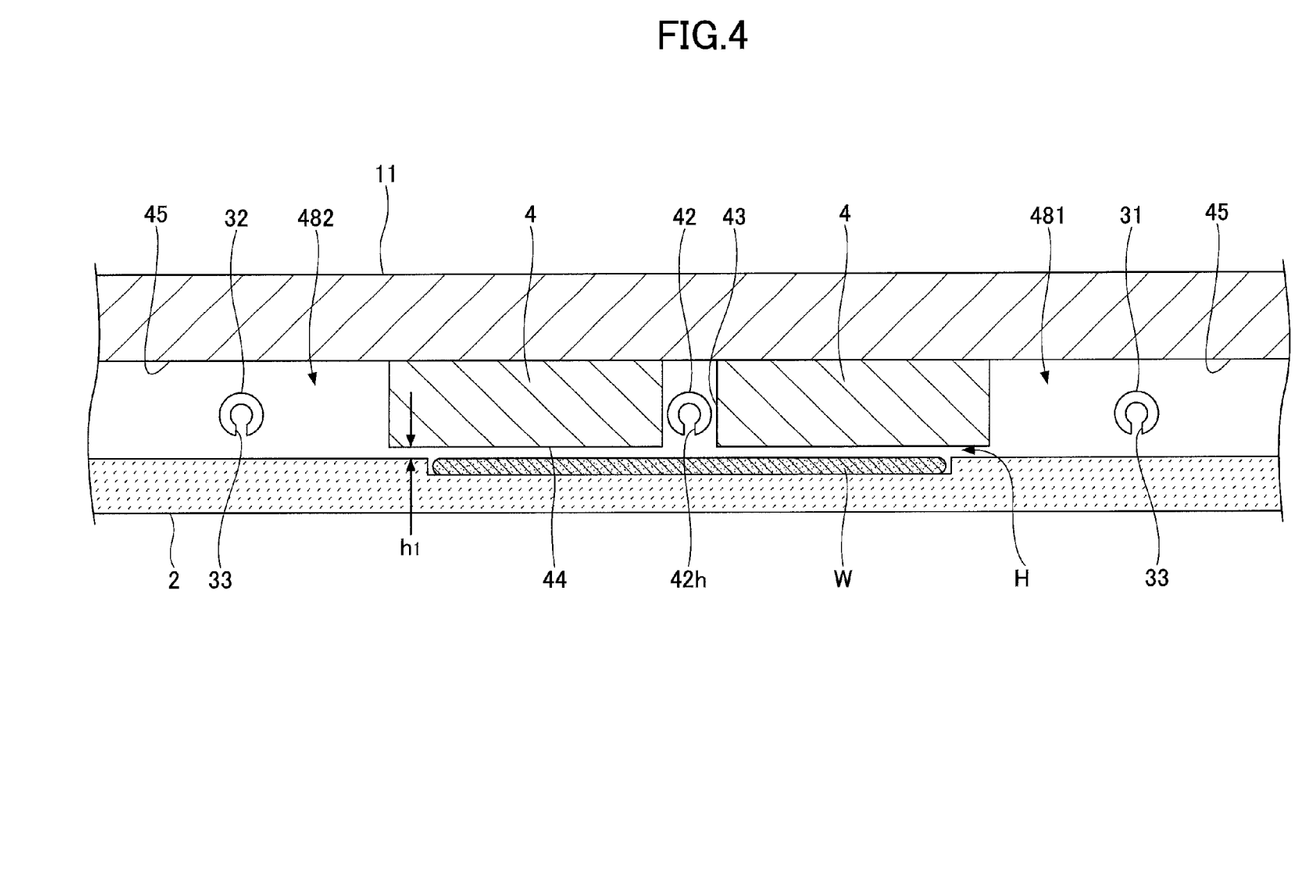
FIG. 4 is a schematic cross-sectional view of the film deposition apparatus in FIG. 1.

With reference to FIGS. 2 and 3, two convex portions 4 are provided in the vacuum chamber 1. The convex portions 4 have an approximately sectorial planar shape whose apex is cut in an arc-like form. In the present embodiment, the inner arc is coupled to a protrusion portion 5 (which is described below), and the outer arc is arranged so as to be along an inner periphery of the chamber body 12 of the vacuum chamber 1. As will be noted from FIG. 4 showing a cross-sectional view of the vacuum chamber 1 along a virtual line AL concentric with the turntable 2, the convex portion 4 is attached to the back surface of the ceiling plate 11. Because of this, the low ceiling surface 44 (i.e., second ceiling surface) that is a lower surface of the convex portion 4, and the high ceiling surface 45 (i.e., first ceiling surface) higher than the ceiling surface 44, are provided in the vacuum chamber 1. In the following description, a narrow space between the low ceiling surface 44 and the turntable 2 may be called a separation space H. Furthermore, a space between the high ceiling surface 45 and the turntable 2 includes a space 481 including the reaction gas nozzle 31, and a space 482 including the reaction gas nozzle 32.

In addition, as shown in FIG. 4, a groove 43 is formed in the convex portion 4 at the center in the circumferential direction, and the groove portion 43 extends along the radial direction of the turntable 2. The groove portion 43 houses the separation gas nozzle 42. The groove portion 43 is also formed in the other convex portion 4 in a similar way, and the separation gas nozzle 41 is housed therein. When the separation gas nozzle 42 supplies an $N_2$ gas, the $N_2$ gas flows to the spaces 481 and 482 through the separation space H. At this time, because a volume of the separation space is smaller than that of the spaces 481 and 482, a pressure of the separation space H can be higher than that of the spaces 481 and 482 by the $N_2$ gas. In other words, the separation space H provides a pressure barrier between the spaces 481 and 482. Furthermore, the $N_2$ gas flowing from the separation space H to the spaces 481 and 482 is supplied to the first process area P1 and the second process area P2, and works as a counter flow against the $SiH_4$ gas flowing toward the convex portion 4 from the first process area P1 and the $H_2O_2$ gas flowing toward the convex portion 4 from the second process area P2. Accordingly, the $SiH_4$ gas of the first process area P1 and the $H_2O_2$ gas of the second process area P2 can be reliably separated by the separation space H. Hence, a mixture and a reaction of the $SiH_4$ gas and the $H_2O_2$ gas in the vacuum chamber 1 are reduced.

Here, a height h1 of the ceiling surface 44 relative to the upper surface of the turntable 2 is preferably set at an appropriate height to make the pressure of the separation space H higher than the pressure of the spaces 481 and 482, considering the pressure in the vacuum chamber 1, a rotational speed of the turntable 2, and a supply amount of the separation gas (i.e., $N_2$ gas) to be supplied.

With reference to FIGS. 1 through 3 again, a protrusion portion 5 is provided on the lower surface of the ceiling plate 11 so as to surround an outer circumference of the core portion 21 that fixes the turntable 2. In the present embodiment, this protrusion portion 5 continuously extends to a region on the rotational center side of the convex portion 4, and the lower surface of the protrusion portion 5 is formed to be the same height as the ceiling surface 44.

Figure 5:
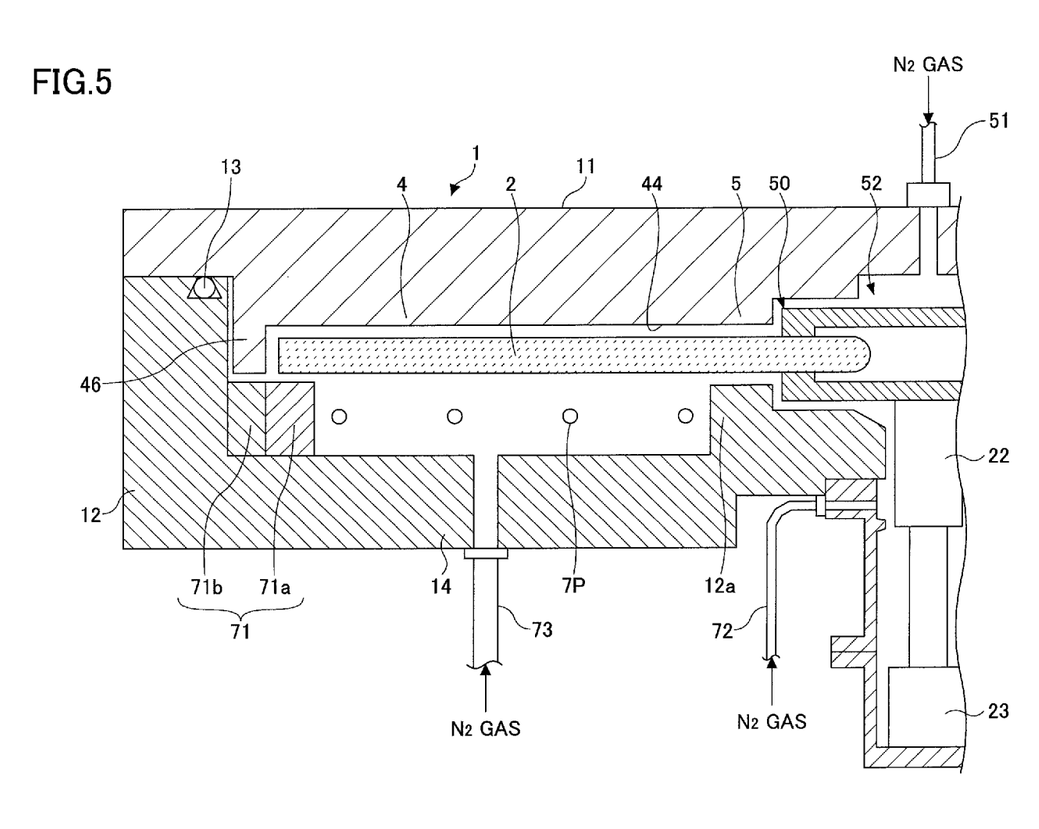
FIG. 5 is partially schematic cross-sectional view of the film deposition apparatus in FIG. 1.

FIG. 1, which was previously referred to, is a cross-sectional view along an I-I' line in FIG. 3, and shows an area where the ceiling surface 45 is provided. On the other hand, FIG. 5 is a partial cross-sectional view illustrating an area where the ceiling surface 44 is provided. As shown in FIG. 8, a bent portion 46 that is bent into an L-letter shape is formed in a periphery of the approximately sectorial convex portion 4 (i.e., a region on the outer edge of the vacuum chamber 1) so as to face the outer edge surface of the turntable 2. The bent portion 46 prevents a gas from circulating between the spaces 481 and 482 through a space between the turntable 2 and the inner periphery of the chamber body 12. Because the sectorial convex portion 4 is provided on the ceiling plate 11, and the ceiling plate 11 is detachable from the chamber body 12, there is a slight gap between the outer periphery of the bent portion 46 and the inner periphery of the chamber body 12. A gap between the inner periphery of the bent portion 46 and the outer edge surface of the turntable 2, and the gap between the outer periphery of the bent portion 46 and the inner periphery of the chamber body are, for example, set at a size similar to a height of the ceiling surface 44 relative to the upper surface of the turntable 2.

With reference to FIG. 3 again, a first evacuation opening 61 in communication with the space 481 and a second evacuation opening 62 in communication with the space 482 are formed between the turntable 2 and the inner periphery of the chamber body 12. As shown in FIG. 1, the first evacuation opening 61 and the second evacuation opening 62 are connected to, for example, vacuum pumps 640 of a evacuation unit through respective evacuation pipes 630. FIG. 1 also shows a pressure controller 650.

Figure 6:
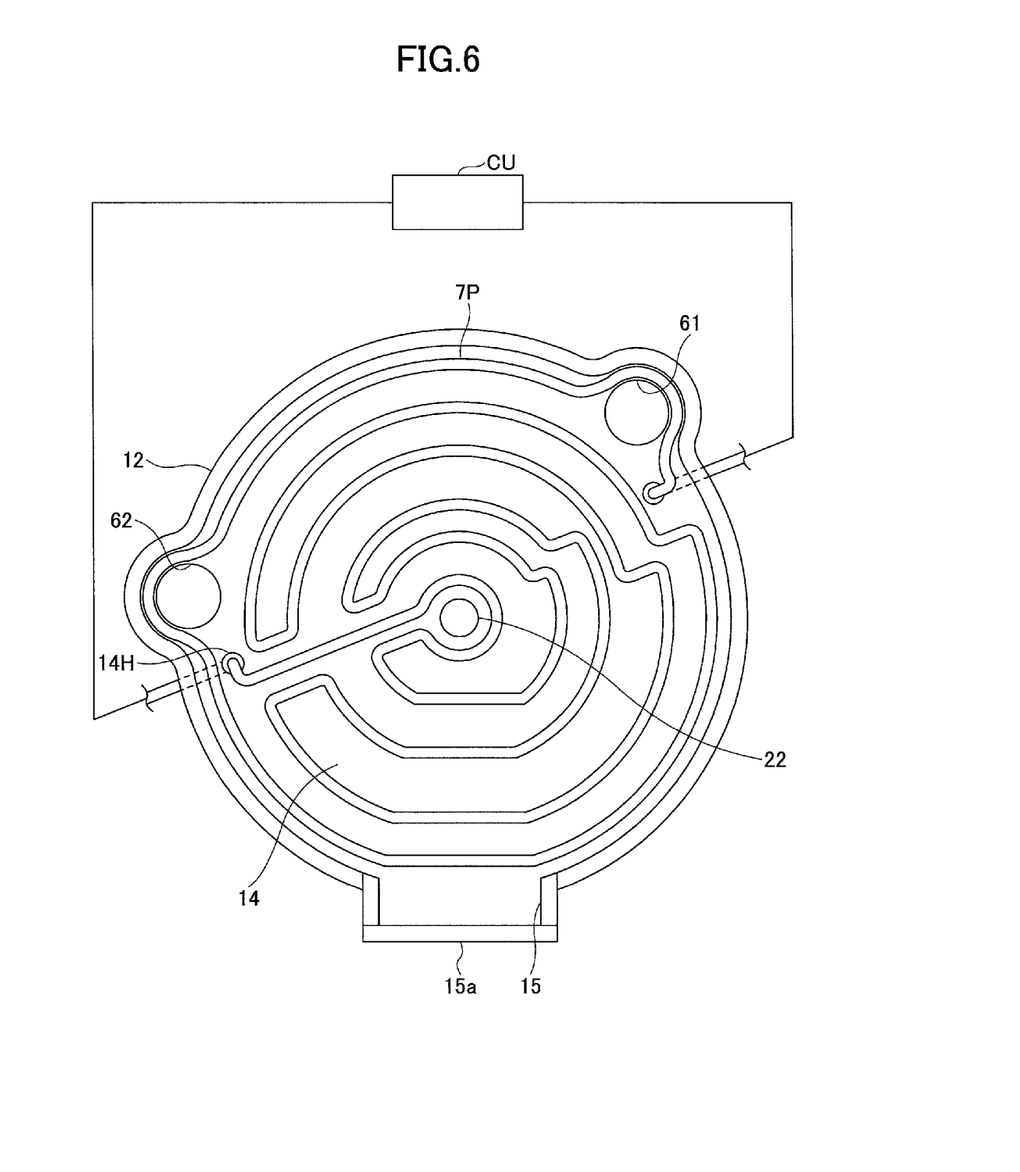
FIG. 6 is another schematic top view of the film deposition apparatus in FIG. 1.

As illustrated in FIGS. 1 and 5, a cooler 7 that is a cooling unit is provided at a height above the bottom part 14 of the vacuum chamber 1 and below the lower surface of the turntable 2. More specifically, as shown in FIG. 6 that is a schematic top view illustrating the chamber body 12 from which the convex portions 4 and turntable 2 is removed, the cooler 7 includes a cooling pipe 7P that is introduced into the chamber body 12 through a introduction terminal 14H provided in the bottom part 14 of the chamber body 12, and a chiller unit CU that circulates a cooling medium adjusted to a predetermined temperature in the cooling pipe 7P. Moreover, a temperature of the turntable 2 is measured by a temperature detector (which is not shown in the drawing) to detect the temperature of the turntable 2 such as a thermocouple and a radiation thermometer, and the temperature of cooling medium is adjusted based on the result, by which not only the turntable 2 but also the wafer W is adjusted, for example, to a temperature equal to or less than room temperature (i.e., 23 degrees).

With reference to FIG. 5 again, a ring-shaped cover member 71 is provided on the lower side of the periphery of the turntable 2 to prevent a gas from intruding into a space under the turntable 2. The cover member 71 includes an inner member 71a provided so as to face the outer edge portion of the turntable 2 and a further outer portion from the lower side, and an outer member 71b provided between the inner member 71a and the inner wall surface of the vacuum chamber 1. The outer member 71b is provided under the bent portion 46 formed in the outer edge portion of the convex portion 4 and close to the bent portion 46, and the inner member 71a is provided to surround the cooler 7 throughout the whole circumference under the outer edge portion of the turntable 2 (and the slightly further outer portion).

As shown in FIGS. 5 and 1, the bottom part 14 in a region closer to the rotational center than the space where the cooler 7 is arranged, forms a protrusion part 12a so as to get closer to the core portion 21 in the center portion of the lower surface of the turntable 2. A gap between the protrusion part 12a and the core portion 21 forms a narrow space. Moreover, a gap between an inner periphery of a through-hole of the rotational shaft 22 that penetrates through the bottom part 14 and the rotational shaft 22 is narrow, and the narrow space is in communication with the case body 20. The case body 20 includes a purge gas supply pipe 72 to supply the $N_2$ gas as a purge gas to the narrow space for purging the narrow space. Furthermore, a plurality of purge gas supply pipes 73 is provided at predetermined angular intervals in the circumferential direction under the heater unit 7 to purge the arrangement space of the heater unit 7 (only a single purge gas supply pipe 73 is shown in FIG. 8).

When the purge gas supply pipe 72 supplies an $N_2$ gas, this $N_2$ gas flows through the gap between the inner periphery of the through-hole and the rotational shaft 22, the gap between the protrusion part 12a and the core portion 21 and the space between the turntable 2 and a lid member 7a, and is evacuated from the first evacuation opening 61 or the second evacuation opening 62 (see FIG. 3). Moreover, when the purge gas supply pipe 72 supplies an $N_2$ gas, the $N_2$ gas flows out from the space including the cooler 7 through a gap between the lid member 7a and the inner member 71a (not shown in the drawing), and is evacuated from the first evacuation opening 61 or the second evacuation opening 62 (see FIG. 3). The flow of the $N_2$ gas can prevent the gases in the space 481 and 482 from being mixed through the space around the center and on the lower side of the vacuum chamber 1, and through the space under the turntable 2.

Furthermore, as shown in FIG. 5, separation gas supply pipe 51 is connected to the central part of the ceiling plate 11 of the vacuum chamber 1, and is configured to supply an $N_2$ gas of the separation gas to a space 52 between the ceiling plate 11 and the core portion 21. The separation gas supplied to the space 52 is discharged toward the outer edge through a narrow space 50 between the protrusion portion 5 and the turntable 2, and along the surface of the turntable 2 on the wafer receiving area side. The space 50 can be maintained at a higher pressure than that of the spaces 481 and 482 by the separation gas. Accordingly, the space 50 serves to prevent the $SiH_4$ gas supplied to the first process area P1 and the $H_2O_2$ gas supplied to the second process area P2 from being mixed through the center area C. In other words, the space 50 (or the center area C) can function as well as the separation space H (or the separation area D).

In addition, as shown in FIGS. 2 and 3, the transfer opening 15 is formed in the side wall of the vacuum chamber 1 to transfer the wafer W, which is the substrate, between the outer transfer arm 10 and the turntable 2. The transfer opening 15 is configured to be hermetically openable and closeable by a gate valve not shown in FIGS. 2 and 3. Moreover, the wafer W is transferred between the wafer receiving portions 24, which are the wafer receiving portions in the turntable 2, and the transfer arm 10 at a position where one of the wafer receiving portions 24 faces the transfer opening 15. Accordingly, lift pins for transfer to lift up the wafer W from the back side by penetrating through the wafer receiving portion 24 and the lifting mechanism (none of which are shown in the drawing) are provided at the position corresponding to the transfer position under the turntable 2.

Moreover, as shown in FIG. 3, a control part 100 to control operations of the whole apparatus is provided in the film deposition apparatus 10 according to the present embodiment. The control part 100 includes a process controller that is, for example, constituted of a computer, a user interface part 100b, and a memory device 100c. The user interface part 100b includes a display to show operating conditions of the film deposition apparatus, and a keyboard or a touch panel (which are not shown in the drawing) to allow an operator of the film deposition apparatus to select a process recipe and to allow a process manager to change a parameter of the process recipe.

The memory device 100c stores a control program to cause the process controller 100a to implement a variety of processes, a process recipe, and parameters in a variety of processes. In addition, the program includes step groups to cause the film deposition apparatus 10 to implement a film deposition method described below. These control program and process recipe are read by the process controller 100a and controlled by the control part 100, in accordance with instructions from the user interface part 100b. Moreover, these programs may be stored in a computer readable storage medium 100d, and may be installed into the memory device 100c through an input/output device (which is not shown in the drawing) corresponding to the computer readable storage medium 100d. The computer readable storage medium 100d may be a hard disk, a CD (Compact Disc), a CD-R/RW (Compact Disc Recordable/ReWritable), DVD-R/RW (Digital Versatile Disc Recordable/ReWritable), a flexible disc, and a semiconductor memory. Furthermore, the program may be downloaded to the memory device 100c through a communication line.

<Film Deposition Method>

Figure 7A:
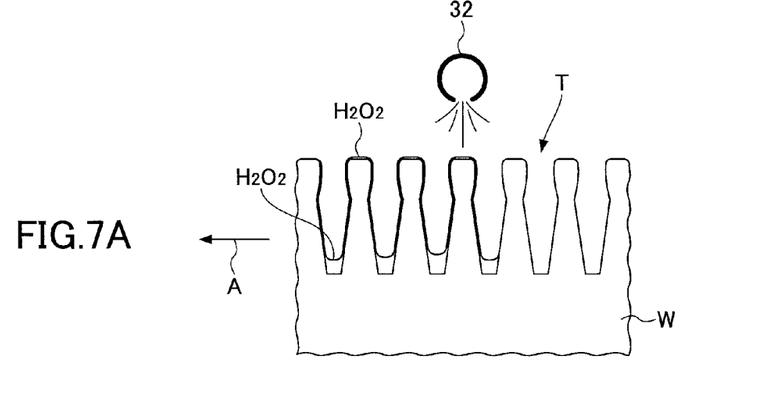
FIGS. 7A through 7E are explanation drawings to explain a film deposition method according to an embodiment of the present invention.
Figure 7B:
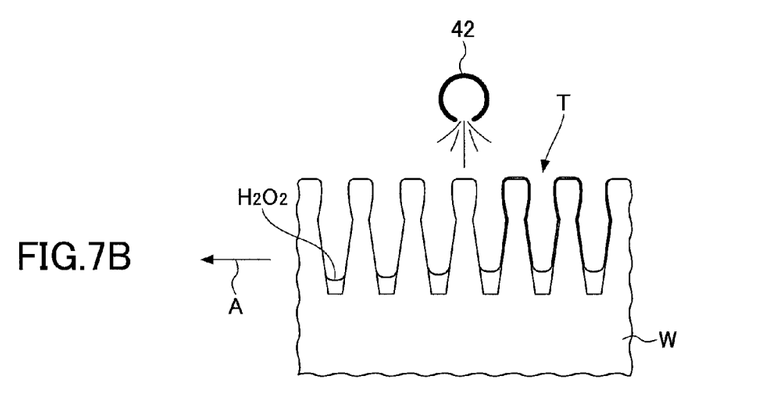

Next, a description is given of a film deposition method according to an embodiment of the present invention, which is implemented by the above-mentioned film deposition apparatus 10, with reference to FIGS. 7A through 7E. In the following description, a silicon wafer is assumed to be used as the wafer W, and trenches whose widths (inner diameter) are wider in a middle part than that (inner diameter) in an opening part and a bottom part are formed in the silicon wafer as illustrated in FIG. 7A.

First, the turntable 2 is adjusted to, for example, 23 degrees by the cooler 7. Next, a gate valve 15a is opened, and a wafer W is transferred into the vacuum chamber 1 through the transfer opening 15 (see FIGS. 2 and 3) by the transfer arm 10 (see FIG. 3), and is placed in the wafer receiving portion 24 of the turntable 2 by the lift pins (which are not shown in the drawings). Such a transfer sequence is performed by rotating the turntable 2 intermittently, and the wafers W are each placed in the five wafer receiving portions 24 of the turntable 2.

Next, the gate valve 15a is closed, and the vacuum chamber 1 is evacuated by the vacuum pump 640 (see FIG. 1) up to a reachable degree of vacuum. After that, the separation gas nozzles 41 and 42 (see FIG. 3) supply an $N_2$ gas of the separation gas at a predetermined flow rate, and the separation gas supply pipe 51 and the purge gas supply pipes 72 and 73 (FIG. 5) also supply an $N_2$ gas of the separation gas at a predetermined flow rate. In response to this, the pressure controller 650 (FIG. 1) controls the pressure in the vacuum chamber 1 so as to become a preliminarily set process pressure. Next, the reaction gas nozzle 32 supplies an $H_2O_2$ gas, and the reaction gas nozzle 31 supplies an $SiH_4$ gas, while rotating the turntable 2 in a direction shown by an arrow A at a rotational speed of, for example, at 20 rpm.

When the wafer W reaches the second process area P2 (i.e., the area under the reaction gas nozzle 32) by rotating the turntable 2, the wafer W being at room temperature is exposed to the $H_2O_2$ gas supplied from the reaction gas nozzle 32, as schematically illustrated in FIG. 7A, the $H_2O_2$ is condensed on a surface of the wafer W or on an inner surface of trenches T. At this time, because the condensed $H_2O_2$ have fluidity and can flow from a mirror surface of the wafer W or an inner surface on the top end side of each of the trenches T to a bottom part of each of the trenches T, a relatively large volume of $H_2O_2$ is accumulated in the bottom part of each of the trenches T. Next, the wafer W is exposed to an $N_2$ gas supplied from the separation gas nozzle 42 of the separation area D when passing the separation area D (i.e., below the separation gas nozzle). The $H_2O_2$ is left in the bottom part (on the bottom surface or the inner surface on the bottom surface side) while the $H_2O_2$ gas evaporates by the $N_2$ gas on the surface of the wafer W or the inner surface on the top end side of each of the trenches T.

Figure 7C:
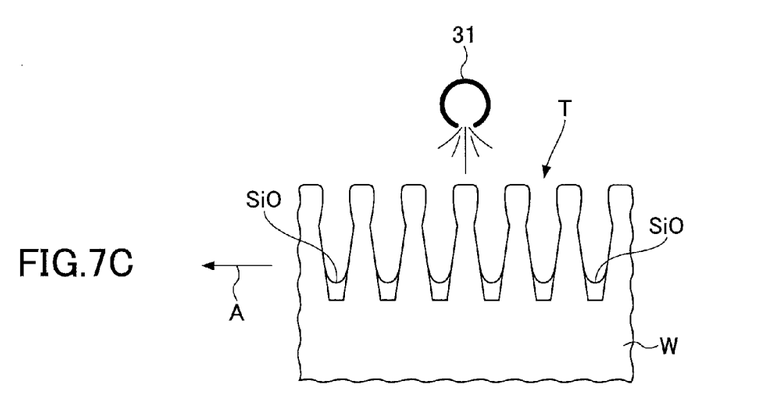

Next, when the wafer W passes through the first process area P1 (an area under the reaction gas nozzle 31), the wafer W is exposed to the $SiH_4$ gas from the reaction gas nozzle 31. This causes the $SiH_4$ gas and the $H_2O_2$ left on the wafer W to react with each other and to produce silicon oxide. At this time, because the $SiH_4$ gas is likely to be absorbed in the $H_2O_2$ (to be adsorbed on the $H_2O_2$), the $SiH_4$ is preferentially adsorbed on the bottom parts of the trenches T in which the $H_2O_2$ remains, and is not very well adsorbed on the inner surface on the top end side. Accordingly, as illustrated in FIG. 7C, the silicon oxide mainly deposits on the bottom parts of the trenches T. In other words, the film thicknesses of the silicon oxide films grow from the bottom parts of the trenches T.

Figure 7D:
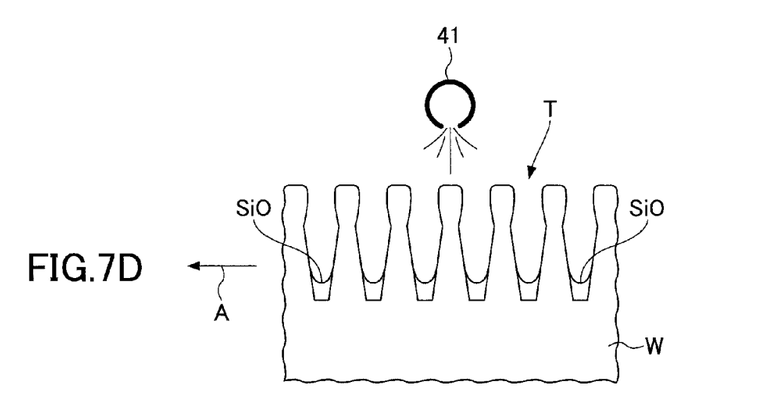
Figure 7E:
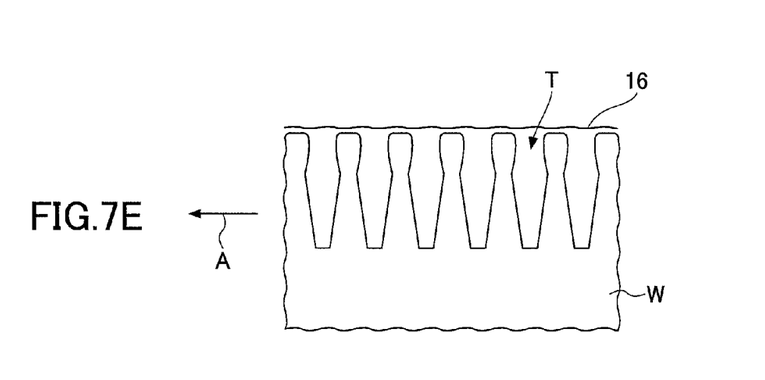

Subsequently, as shown in FIG. 7D, when the wafer W passes through the separation area D (i.e, the separation gas nozzle 41), a side reaction product between the $SiH_4$ gas and the $H_2O_2$ (e.g., water ($H_2O$)) is released by the $N_2$ gas from the separation gas nozzle 41.

As described above, according to the film deposition method of the embodiments of the preset invention, when the reaction gas nozzle 32 supplies the $H_2O_2$ gas to the wafer W, the $H_2O_2$ is condensed on the wafer W, and the $N_2$ gas supplied from the separation gas nozzle 42 of the separation area D causes the $H_2O_2$ condensed on the surface of the wafer W or the inner surfaces on the top end part of the trenches T to evaporate, by which the $H_2O_2$ remains in the bottom parts of the trenches T. The $SiH_4$ gas supplied from the reaction gas nozzle 31 is absorbed in the $H_2O_2$ remaining in the bottom parts and oxidized, and the silicon oxide is produced. Due to this, the trenches T are getting filled with the silicon oxide from the bottom parts, and the trenches T are filled up with silicon oxide film 16.

When a silicon oxide film is deposited along an inner surface shape of the trench T (in a conformal manner), surfaces of the silicon oxide film deposited on both side surfaces of the trench T approach each other as the thicknesses of the silicon oxide film on both side surfaces increase, and eventually contact with each other, by which the trench T is filled with the silicon oxide film. In this case, the density of the defects and impurities is thought to be high at the contact surface (i.e., seam), which is likely to cause a void along the seam in a later heating process or an etching process.

However, according to the embodiments of the present invention, because the trench T is filled from the bottom part, the seam cannot be formed. Accordingly, this prevents a void along the seam, which can be caused in a later process, from being formed.

In the film deposition method according to the present embodiments, because the turntable 2 is cooled at a temperature equal to or lower than room temeprature (i.e., approximate 23 degrees), which is, for example, 12 degrees or more and less than 23 degrees, the wafer W is also cooled to the approximate same temperature, and therefore the $H_2O_2$ can be readily condensed on the wafer W.

Here, when the supply amount of the $H_2O_2$ gas is too much, the $H_2O_2$ that does not react with the $SiH_4$ is left, and a void is formed in the silicon oxide film filling in the trench T when the remaining $H_2O_2$ evaporates. Hence, it is evident that the amount of condensation should be properly adjusted by adjusting the supply amount of the $H_2O_2$, the temperature of the wafer W, and the supply amount of the separation gas in the separation area D. In addition, it is also evident that the supply amount of silane gas should be adjusted depending on the proper amount of the condensation of the $H_2O_2$. These adjustments can be performed, for example, based on a preliminary experiment.

Next, a description is given below of a result of an experiment performed to confirm an effect of a film deposition method according to the embodiments.

Figure 8A:
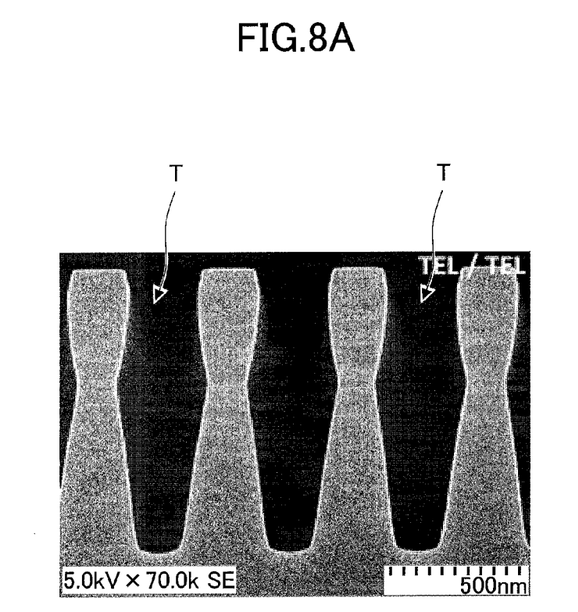
FIGS. 8A and 8B are scanning electron microscopic images showing a result of an experiment performed to confirm an effect of a film deposition method of the present embodiment.
Figure 8B:
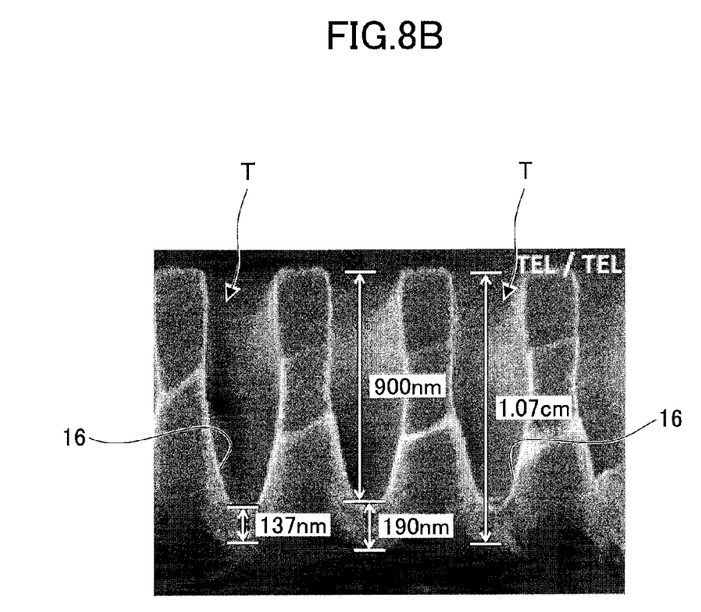

FIG. 8A is a scanning electron microscope (SEM) image showing trenches T formed in a wafer W. FIG. 8B is a SEM image showing the trenches T and silicon oxide films deposited in the trenches T according to the above-mentioned film deposition method. Major film deposition conditions used in the experiment are described as follows.

Temperature of Wafer: 15 degrees
Pressure in Vacuum Chamber 1: 4 Torr (533.3 Pa)
Supply Amount of $SiH_4$ Gas: 10 standard cc/min (sccm)
Supply Amount of $H_2O_2$ gas: 100 sccm
Supply Amount of $N_2$ gas from Sepatation Gas Nozzle 41 and 42: 6 standard l/min (slm)
Rotational Speed of Turntable 2: 10 revolutions per minute (rpm)
Film Deposition Time Period: 100 minutes.

As shown in FIG. 8B, compared to the film thicknesses of the silicon oxide films 16 deposited in the bottom part of the trenches T (whose depth is approximate 1 cm) in a range approximately from 137 nm to 190 nm, deposition of the silicon oxide film in the trenches T, for example, at the upper part of the side wall, is scarcely acknowledged. In other words, according to the film deposition method of the embodiments, it is noted that the silicon oxide films can be mainly deposited in the bottom parts of the trenches T. In this experiment, although the film deposition was stopped at an elapse of 100 minutes and the cross-section was observed, it is readily inferred that the trenches T are filled with the silicon oxide films 16 from the bottom parts if the film deposition is continued further for a longer time period. In other words, according to the film deposition method of the embodiments, it is confirmed that the trenches T formed in the wafer can be filled with the silicon oxide from the bottom parts without forming a seam.

Modification Example

In the above-mentioned film deposition method, although the wafer W is exposed to the $H_2O_2$ gas, the $N_2$ gas, the $SiH_4$ gas, and the $N_2$ gas, the wafer W may be exposed to oxygen plasma after being exposed to the $SiH_4$ gas (i.e., after the wafer W passes through the first process area P1). This allows the silicon oxide film deposited by the reaction of the $H_2O_2$ with the $SiH_4$ gas to be modified by the oxygen plasma. More specifically, when high-energy particles collide with the silicon oxide film, silicon atoms or oxygen atoms vibrate due to the energy and can be rearranged. Because of this, the silicon oxide film can be enhanced. Moreover, water in the silicon oxide film can be released from the silicon oxide film due to the high energy. This allows a more dense silicon oxide film to be obtained.

Figure 9:
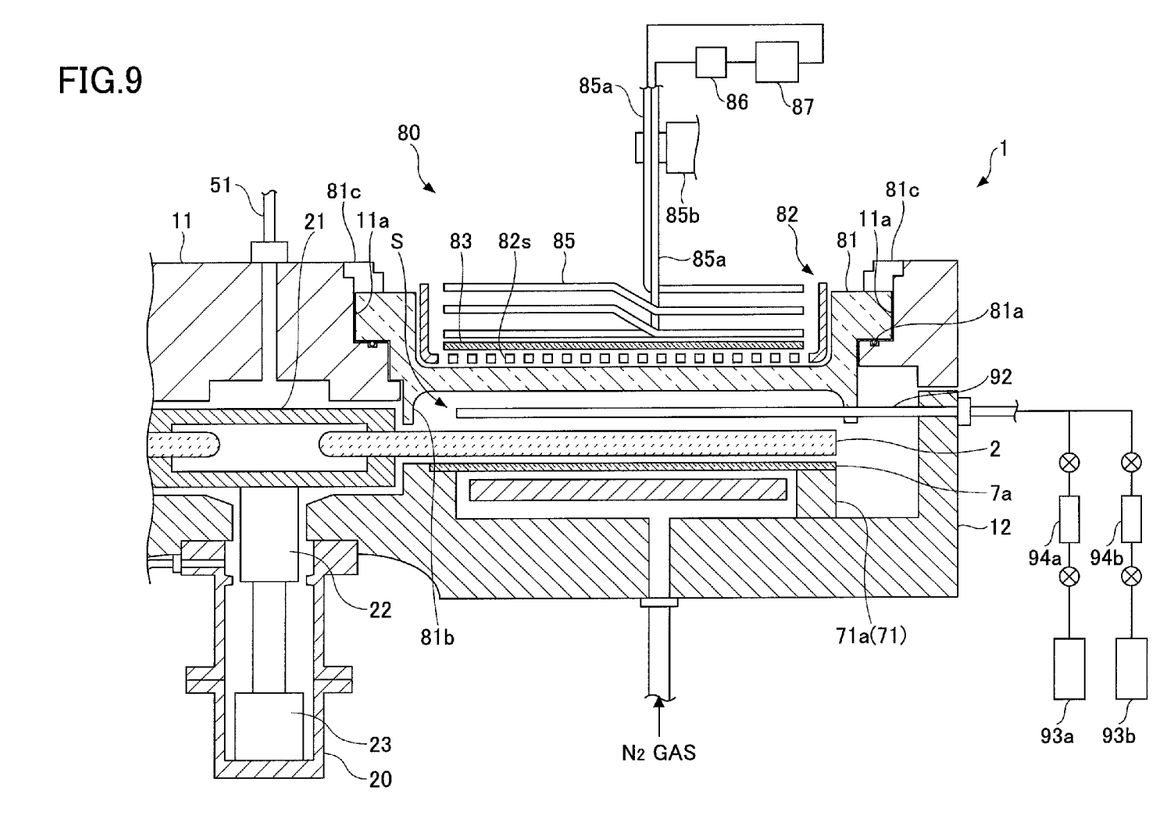
FIG. 9 is a schematic cross-sectional view illustrating a plasma generator provided in the film deposition apparatus of FIG. 1, preferably to implement a film deposition method according to a modification film deposition method of the present embodiment.
Figure 10:
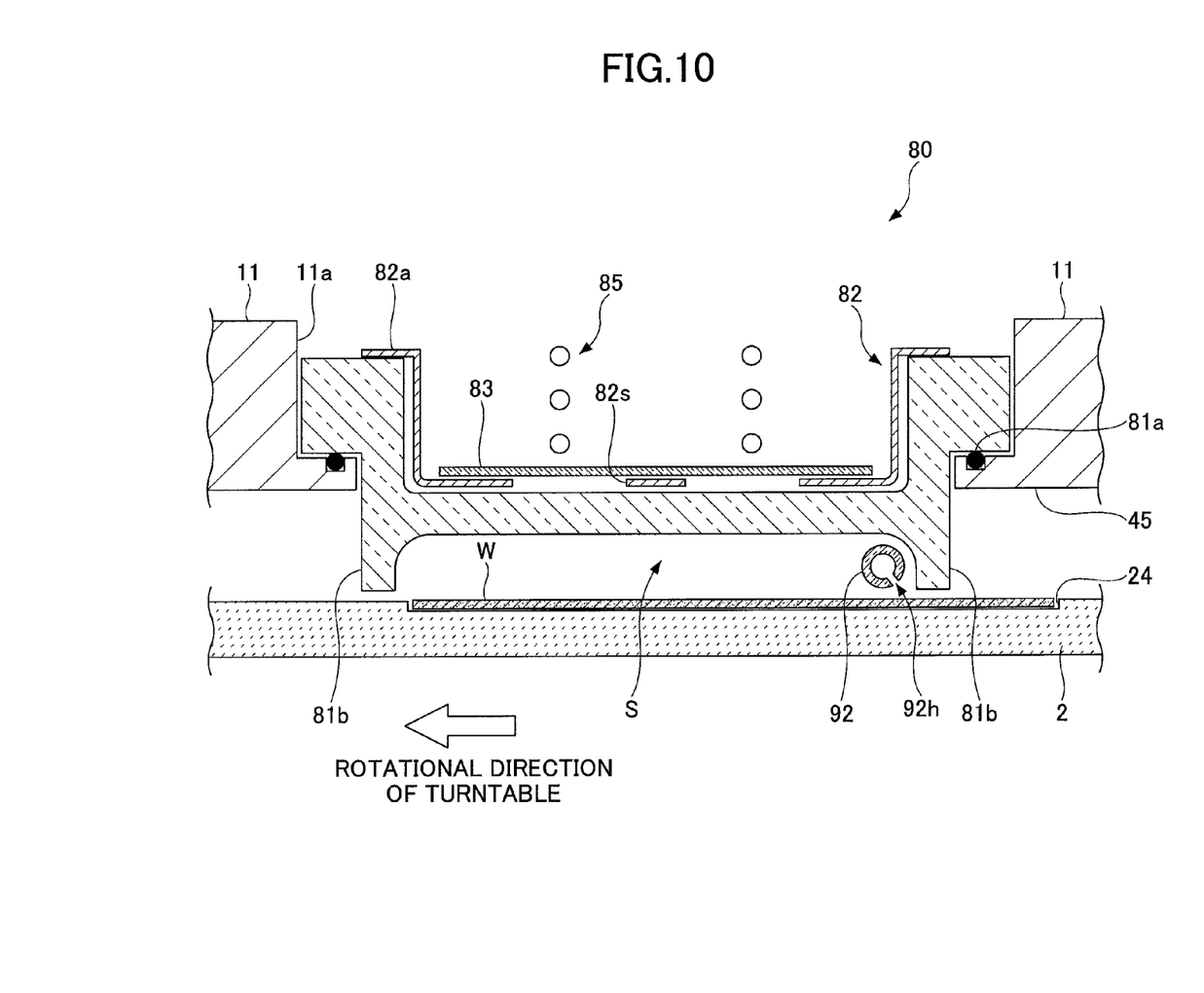
FIG. 10 is another schematic cross-sectional view illustrating the plasma generator shown in FIG. 9.
Figure 11:
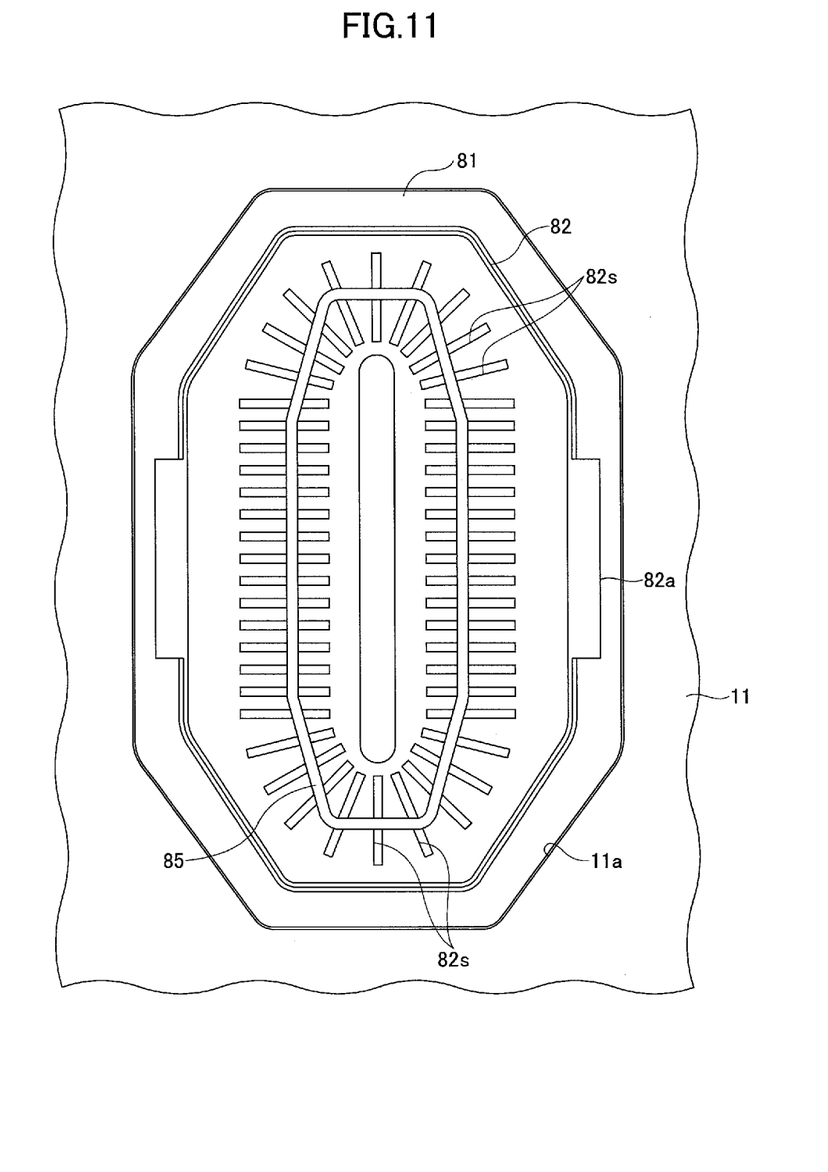
FIG. 11 is another schematic top view illustrating the plasma generator shown in FIG. 9.

Next, a description is given below of the plasma generator, with reference to FIGS. 3 and 10 through 12. As illustrated by dotted lines in FIG. 3, the plasma generator 80 is arranged on the downstream side of the convex portion 4 housing the separation gas nozzle 41 and on the upstream side of the reaction nozzle 32, along the rotational direction of the turntable 2 (which is shown by the arrow A) in the vacuum chamber 1 of the film deposition apparatus 10. FIG. 9 is a schematic cross-sectional view of the plasma generator 80 along a radial direction of the turntable 2. FIG. 10 is a schematic cross-sectional view of the plasma generator 80 along a direction perpendicular to the radial direction of the turntable 2. FIG. 11 is a schematic top view illustrating the plasma generator 80. Some members are simplified in these drawings for convenience of depiction.

With reference to FIG. 9, the plasma generator 80 is made of a radio frequency transmissive material, and has a concave portion recessed from the top surface. The plasma generator 80 includes a frame member 81 that is set in an opening portion 11a formed in the ceiling plate 11, a Faraday shield plate 82 having a boxy shape whose top surface is open and housed in the concave portion of the frame member 81, an insulating plate 83 disposed on a bottom surface of the Faraday shield plate 82, and a coiled antenna 85 supported on the upper side of the insulating plate 83 and having a top surface shape of an approximate octagon.

The opening portion 11a of the ceiling plate 11 includes a plurality of steps, and a groove portion is formed in one of the plurality of steps throughout the whole circumference, in which a sealing member 81a such as an O-ring is set. On the other hand, the frame member 81 includes a plurality of steps corresponding to the steps of the opening portion 11a. When the frame member 81a is set in the opening portion 11a, the back surface of one step contacts the sealing member 81a set in the groove portion of the opening portion 11a, by which air tightness between the ceiling plate 11 and the frame member 81 is maintained. Moreover, as illustrated in FIG. 9, a pressing member 81c is provided along the outer circumference of the frame member 81 set in the opening portion 11a of the ceiling plate 11, by which the frame member 81 is pressed down against the ceiling plate 11. By doing this, air tightness between the ceiling plate 11 and the frame member 81 is reliably maintained.

A lower surface of the frame member 81 faces the turntable 2 in the vacuum chamber 1, and an outer periphery of the lower surface includes a projection portion 81b projecting downward (i.e., toward the turntable 2) throughout the whole circumference. A lower surface of the projection portion 81b is close to the surface of the turntable 2. The projection portion 81b, the surface of the turntable 2 and the lower surface of the frame member 81 form a space (which is hereinafter called an inner space S) above the turntable 2. Here, a distance between the lower surface of the projection portion 81b and the surface of the turntable 2 may be approximately the same as a height h1 of a ceiling surface 44 relative to the upper surface of the turntable 2 in a separation area H (see FIGS. 4 and 9).

Furthermore, the gas introduction nozzle 92 that penetrates the projection portion 81b extends in the inner space S. In the present embodiment, as illustrated in FIG. 9, the gas introduction nozzle 92 is connected to an argon gas supply source 93a filled with an argon (Ar) gas and to an oxygen gas supply source 93b filled with an oxygen ($O_2$) gas. The Ar gas and $O_2$ gas, whose flow rates are controlled by corresponding flow rate controllers 94a and 94b, are supplied to the inner space S at a predetermined flow ratio (i.e., mixture ratio) from the argon gas supply source 93a and the oxygen gas supply source 93b.

In addition, the gas introduction nozzle 92 includes a plurality of discharge holes 92h formed at predetermined intervals (e.g., 10 mm) along a lengthwise direction (see FIG. 10), and the discharge holes 92h discharge the above-mentioned Ar gas and the like. As illustrated in FIG. 10, the discharge holes 92h are inclined toward the upstream side in the rotational direction of the turntable 2 relative to a direction perpendicular to the turntable 2. Because of this, the gas supplied from the gas introduction nozzle 92 is discharged toward the direction opposite to the rotational direction of the turntable 2, more specifically, to a gap between the lower surface of the projection portion 81b and the surface of the turntable 2. This prevents the reaction gas or the separation gas from flowing into the inner space S from a space under a ceiling surface 45 located on the upstream side of the plasma generator 80 along the rotational direction of the turntable 2. In addition, as discussed above, because the projection portion 81b formed along the outer periphery of the lower surface of the frame member 81 is close to the surface of the turntable 2, a pressure in the inner space S can be readily kept high due to the gas from the introduction gas nozzle 92. This also prevents the reaction gas and the separation gas from flowing into the inner space S.

The Faraday shield plate 82 is made of a conductive material such as metal, and is grounded, though the depiction is omitted in the drawing. As clearly shown in FIG. 11, a plurality of slits 82s is formed in the bottom portion of the Faraday shield plate 82. Each of the slits 82s extends so as to be approximately perpendicular to a corresponding side of the antenna 85 having a planar shape approximating an octagon.

Moreover, as illustrated in FIGS. 10 and 11, the Faraday shield plate 82 includes supporting portions 82a that are folded outward at two locations in the upper end. The supporting portions 82a are supported by the upper surface of the frame member 81, by which the Faraday shield plate 82 is supported at a predetermined position in the frame member 81.

The insulating plate 83 is made of, for example, quartz, having a size slightly smaller than the bottom surface of the Faraday shield plate 82, and is disposed on the bottom surface of the Faraday shield plate 82. The insulating plate 83 transmits radio frequency waves radiated from the antenna 85 downward while insulating the Faraday shield plate 82 from the antenna 85.

The antenna 85 is formed, for example, by triply winding a hollow pipe made of copper so as to form the approximate octagon with respect to the planar shape. Cooling water can be circulated in the pipe, which prevents the antenna 85 from being heated to a high temperature caused by the radio frequency waves supplied to the antenna 85. Moreover, as illustrated in FIG. 4, the antenna 85 includes a standing portion 85a, and a supporting portion 85b that is attached to the standing portion 85a. The supporting portion 85b serves to maintain the antenna 85 in a predetermined location within the Faraday shield plate 82. Moreover, the supporting portion 85b is connected to a radio frequency power source 87 through a matching box 86. The radio frequency power source 87 can generate radio frequency waves, for example, with 13.56 MHz.

According to the plasma generator 80 having such a configuration, when the radio frequency power source 87 supplies the radio frequency power to the antenna 85, the antenna 85 generates an electromagnetic field. An electric field component of the electromagnetic field cannot transmit downward because the electric field is blocked by the Faraday shield plate 82. On the other hand, a magnetic field component transmits into the inner space S through the plurality of slits 82s of the Faraday shield plate 82. This magnetic field component causes plasma to be generated from the gases such as the Ar gas, $O_2$ gas, $NH_3$ gas and the like supplied to the inner space S from the gas introduction nozzle 92 at the predetermined flow ratio (i.e., mixture ratio). The plasma generated in this manner can reduce irradiation damage to the thin film deposited on the wafer W or damage to respective members within the vacuum chamber 1.

As discussed above, although the embodiments and working examples of the present invention have been described in detail, it should be understood that various changes, substitutions, and alterations could be made hereto without departing from the spirit and scope of the invention.

For example, an organic aminosilane gas may be used instead of the $SiH_4$ gas as the silicon-containing gas. When using the organic aminosilane gas, because an organic substance is likely to be mixed in the silicon oxide produced by reacting with the $H_2O_2$, the wafer W is preferably irradiated with oxygen plasma by using the plasma generator 80 in order to remove the organic substance.

Here, when the wafer W is irradiated with the oxygen plasma, the temperature of the wafer W may be increased, and the $H_2O_2$ is liable to become hard to be condensed. To prevent this, the plasma generator 80 may be located as far as possible from the reaction gas nozzle 32, and a supply nozzle to supply the wafer W with an $N_2$ gas for cooling may be provided between the plasma generator 80 and the reaction gas nozzle 32.

According to embodiments of the present invention, there is provided a film deposition method and a film deposition apparatus capable of preventing a seam from being formed in filling a concave portion of a substrate.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A film deposition method, comprising steps of:
condensing hydrogen peroxide on a substrate including a concave portion formed in a surface thereof by supplying a gas containing the hydrogen peroxide;
evaporating the hydrogen peroxide condensed on the surface of the substrate and an inner surface on a top side of the concave portion while leaving the hydrogen peroxide condensed on an inner surface on a bottom side and on a bottom surface of the concave portion by supplying an inactive gas to the substrate, after condensing the hydrogen peroxide on the substrate; and
supplying a silicon-containing gas reactable with the hydrogen peroxide condensed on the inner surface on the bottom side and on the bottom surface of the concave portion to the substrate, after evaporating the hydrogen peroxide condensed on the surface of the substrate and the inner surface on the top side of the concave portion.

2. The film deposition method as claimed in claim 1, wherein the step of condensing the hydrogen peroxide and the step of supplying the silicon-containing gas are alternately repeated a plurality of times.

3. The film deposition method as claimed in claim 2, further comprising a step of:
   supplying the inactive gas to the substrate supplied with the silicon-containing gas, before the step of condensing the hydrogen peroxide.

4. The film deposition method as claimed in claim 1, further comprising a step of:
   maintaining the substrate at a temperature equal to or less than room temperature.

5. The film deposition method as claimed in claim 1, wherein the silicon-containing gas is a silane gas.

* * * * *